(12) United States Patent
Vashchenko

(10) Patent No.: US 9,543,296 B2
(45) Date of Patent: Jan. 10, 2017

(54) ESD CLAMP WITH AUTO BIASING UNDER HIGH INJECTION CONDITIONS

(71) Applicant: NATIONAL SEMICONDUCTOR CORPORATION, Santa Clara, CA (US)

(72) Inventor: Vladislav Vashchenko, Palo Alto, CA (US)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 611 days.

(21) Appl. No.: 14/049,888

(22) Filed: Oct. 9, 2013

(65) Prior Publication Data

US 2014/0034996 A1   Feb. 6, 2014

Related U.S. Application Data

(62) Division of application No. 12/928,715, filed on Dec. 17, 2010, now abandoned.

(51) Int. Cl.
*H01L 27/07* (2006.01)
*H01L 27/02* (2006.01)

(52) U.S. Cl.
CPC ....... *H01L 27/0711* (2013.01); *H01L 27/0262* (2013.01)

(58) Field of Classification Search
CPC .................. H01L 27/0262; H01L 27/0711
USPC ........................................................ 361/56
See application file for complete search history.

(56) References Cited

U.S. PATENT DOCUMENTS

| | | | |
|---|---|---|---|
| 5,212,618 A | 5/1993 | O'Neill et al. | |
| 2001/0043449 A1 | 11/2001 | Okushima | |
| 2002/0053705 A1* | 5/2002 | Kondo | H01L 21/8249 257/368 |
| 2002/0096742 A1 | 7/2002 | Voldman | |
| 2005/0275027 A1 | 12/2005 | Mallikarjunaswamy | |
| 2006/0071236 A1* | 4/2006 | Jensen | H01L 29/7302 257/133 |

* cited by examiner

*Primary Examiner* — Thienvu Tran
*Assistant Examiner* — Kevin J Comber
(74) *Attorney, Agent, or Firm* — Jacqueline J. Garner; Charles A. Brill; Frank D. Cimino

(57) ABSTRACT

In a dual direction ESD protection circuit formed from multiple base-emitter fingers that include a SiGe base region, and a common sub-collector region, the I-V characteristics are adjusted by including P+ regions to define SCR structures that are operable to sink positive and negative ESD pulses, and adjusting the layout and distances between regions and the number of regions.

9 Claims, 3 Drawing Sheets

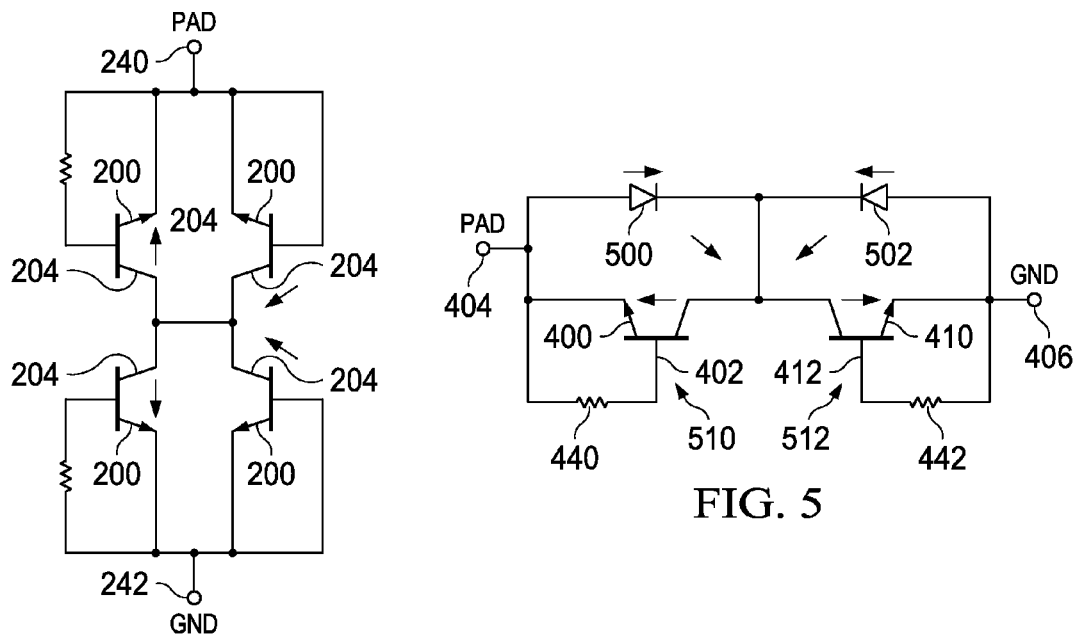
FIG. 3
(PRIOR ART)
FIG. 5
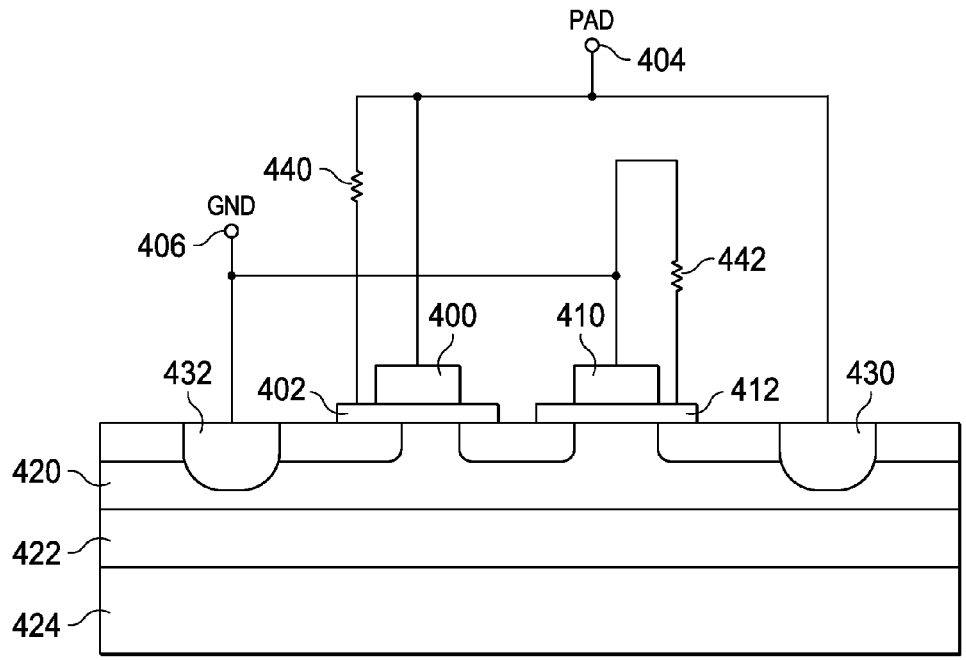
FIG. 4

ESD CLAMP WITH AUTO BIASING UNDER
HIGH INJECTION CONDITIONS

CROSS-REFERENCE TO RELATED
APPLICATIONS

This application is a division of application Ser. No. 12/928,715, filed Dec. 17, 2010, the entirety of which is hereby incorporated by reference.

FIELD OF THE INVENTION

The invention relates to Electrostatic Discharge (ESD) devices. In particular it relates to dual direction ESD solutions.

One of the most challenging Electrostatic Discharge (ESD) problems involves dual direction protection.

One approach that has been adopted in the past is the use of DIAC and ADIAC architectures, which have a compact, small footprint. However these devices are based on non-self-aligned BJT junctions and therefore don't always have good turn-on voltage. One such device is shown in FIG. 1, which shows a section through a DIAC formed in a P-substrate 100. An N-well 102 is formed in the substrate 100, and an R-well 104 is in turn formed in the N-well 102. A P+ region 110 and an N+ region 112 are formed in the R-well 104, and a connected together to define an anode. A second P+ region 120 and N+ region 122 are formed in a P-well in the substrate 100 and are connected together to define a cathode. Another N+ region 130 is formed in the N-well 102 and a contact region to the P-substrate is provided by another P+ region 132.

Another approach has been to make use of a standard multi-finger NPN or BSCR without a collector (cathode) region. A multi-finger NPN is shown in FIG. 2, with the NPN structures connected back to back as shown in the corresponding schematic circuit diagram of FIG. 3. Referring again to FIG. 2, the NPN structures comprise N-emitters 200 formed on P-type bases 202, which are in turn formed on top of an epitaxial region 204. An N-buried layer (NBL) 210 is formed in the epi 204. As is shown in FIGS. 2 and 3, two of the NPN structures have their emitters 200 connected to a pad 240, while two of the NPN structures are connected with their emitters 200 to ground 242. All of the NPN structures have their collectors connected together as defined by a common N-doped region of epi 204. The NPN bipolar junction transistors (BJTs) provide a high holding voltage but saturates at high current levels. In order to increase the ESD protection window and allow the NPN configuration to handle higher current levels, requires that the NPN BJT-based dual direction clamps be integrated in a relatively large footprint.

In contrast, SCR devices are capable of providing higher currents than NPN BJTs due to double injection, however they have lower holding voltages.

SUMMARY OF THE INVENTION

The present invention provides for a hybrid BJT-BSCR dual direction clamp that allows the current-voltage characteristics to be controlled. Preferably the clamp is implemented using a selective base epitaxial region in which an element other than silicon is selectively added to the epitaxial region to define a base epitaxial region, e.g. silicon germanium (SiGe) base epitaxial region (SiGe base epi). For purposes of this application the SiGe base epi or other base epi having an element other than silicon added to the epitaxial region, will be referred to as a selective base epi.

According to the invention there is provided a dual direction ESD protection circuit, comprising multiple base-emitter regions with a shared sub-collector defining a multi-finger NPN, and multiple P+ diffusion regions, at least one of the P+ diffusion regions being connected to one or more base-emitter regions and to a pad, and at least one other of the P+ diffusion regions being connected to one or more other base-emitter regions and to ground, the bases of the base-emitter regions comprising selective base epi regions. The P+ diffusion regions may comprise P+ diffusion fingers or P+ diffusion rings. The multi-finger NPN may comprise SiGe base epi regions. The base-emitter regions connected to the pad may comprise an emitter connected directly to the pad and a base connected to the pad via a resistor. The base-emitter regions connected to ground may comprise an emitter connected directly to ground and a base connected to ground via a resistor.

Further, according to the invention, there is provided a dual direction ESD protection circuit, comprising at least one first NPN BJT and at least one second NPN BJT, the NPN BJTs sharing a common collector region and having a base and an emitter, wherein the base comprises a selective base epitaxial region, the circuit further comprising at least one first P+ diffusion region connected to the base and emitter of the at least one first NPN BJT, and at least on second P+ diffusion region connected to the base and emitter region of the at least one to second NPN BJT. The P+ diffusion regions may comprise P+ diffusion fingers or P+ diffusion rings. The NPN BJTs may comprise a multi-finger SiGe BJT. The emitter and base of the at least one first NPN BJT may be connected to a high voltage rail and the emitter and base of the at least one second NPN BJT may be connected to ground. The base of the at least one first NPN BJT may be connected to the high voltage rail via a first resistor, and the base of the at least one second NPN BJT may be connected to ground via a second resistor. The at least one first P+ diffusion region may be formed in an N-type region to define a first diode, and the at least one second P+ diffusion region may be formed in an N-type region to define a second diode. The N-type regions may comprise a shared N-epitaxial region.

A method of controlling the current-voltage curve of a dual direction protection circuit that includes multiple base-emitter regions with a shared collector defining a multi-finger NPN, and multiple P+ diffusion regions, at least one of the P+ diffusion regions being connected to one or more base-emitter regions and to a pad, and at least one other of the P+ diffusion regions being connected to one or more other base-emitter regions and to ground, wherein the base-emitter region includes a selective base epi region, the method comprising adjusting at least one of, the number of P+ diffusion regions connected to the one or more base-emitter regions and to the pad, the number of P+ diffusion regions connected to the one or more base-emitter regions and to ground, the number of base-emitter regions connected to the pad, the number of base-emitter regions connected to ground, and the distance between one or more of the P+ regions and one or more of the base-emitter regions. The base-emitter regions connected to the pad may comprise an emitter connected directly to the pad and a base connected to the pad via at least one first resistor, and the base-emitter regions connected to ground may comprise an emitter connected directly to ground and a base connected to ground via at least one second resistor, the method comprising adjusting at least one of, at least one first resistor value, and at least one second resistor value. The selective base epi region may comprise a SiGe base epi region.

BRIEF DESCRIPTION OF THE DRAWINGS

FIG. 3 a circuit diagram of the clamp of FIG. 2;

FIG. 4 shows a cross-section through one embodiment of an ESD protection circuit of the invention;

FIG. 5 shows a schematic circuit diagram of an ESD protection circuit of the invention;

DETAILED DESCRIPTION OF THE INVENTION

Figure 1:
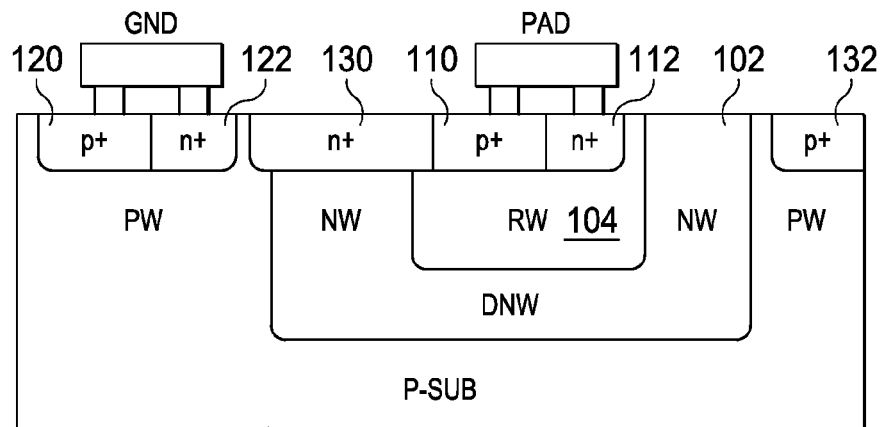
FIG. 1 is a cross-section through a prior art DIAC.
Figure 2:
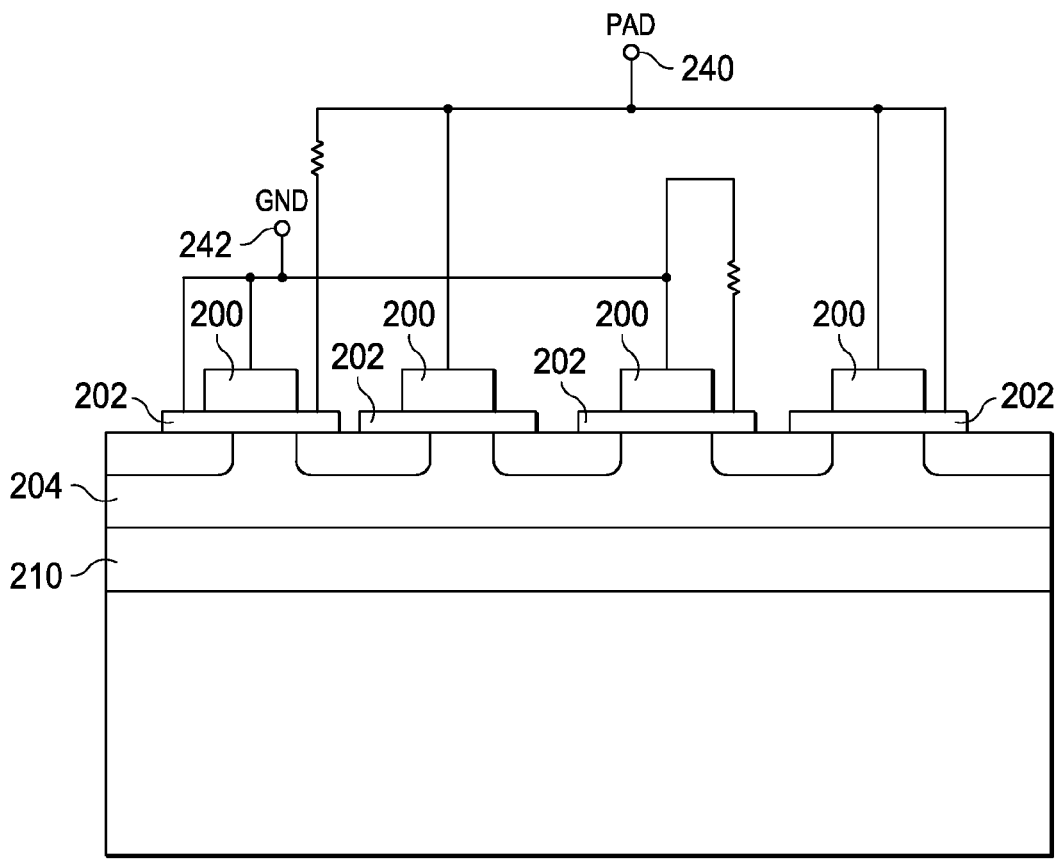
FIG. 2 is a cross-section through a prior art back to back NPN clamp with shared sub-collector.

The present invention defines a dual direction ESD protection circuit that can readily be adjusted to achieve different current-voltage (I-V) characteristics. In particular, the holding voltage and on-state resistance can be adjusted.

FIG. 4 shows a cross-section through one embodiment of an ESD protection circuit of the invention, which includes an NPN BJT that has two base-emitter fingers and a common sub-collector. The base-emitter fingers comprise a first emitter 400 and a first base 402 connected to a high voltage rail or pad 404, and a second emitter 410 and second base 412 connected to ground 406. The common sub-collector is defined by an N-epitaxial region 420, which in this embodiment includes selective SiGe epitaxial regions to define SiGe base epitaxial regions below bases 402, 412. The SiGe base epi regions provide a bandgap that is different from pure silicon and allows for a very high speed NPN with Ft over 300 GHz. The remaining epitaxial region 420 is N-doped to define an N-epi sub-collector for the BJT. As shown in FIG. 4, an n-buried layer (NBL) 422 is formed in the epi, leaving epitaxial region 424 below the NBL. The epi region 424 is p-doped. In this embodiment a first P+ region 430 is connected to the pad 404. A second P+ region 432 is connected to ground 406. By providing P+ regions 430, 432 the BJTs are capable of adopting bipolar SCR (BSCR) characteristics as is discussed in greater detail below.

A schematic circuit diagram of the circuit of FIG. 4 is shown in FIG. 5. The first emitter 400 and base 402 are connected to the pad 404, while the second emitter 410 and base 412 are connected to ground 406. As is shown in both FIG. 4 and the schematic of FIG. 5, the first base 402 is connected to the pad 404 via a resistor 440, and the second base 412 is connected to ground via a resistor 442. The shared sub-collector region (N-epi 420) is depicted in FIG. 5 by the connected collectors. The P+ region 430 formed in the N-epi defines a first diode 500, while the P+ region 432 formed in the N-epi defines a second diode 502, the P+ region 430 forming the anode of the first diode 500, and the P+ region 432 forming the anode of the second diode 502. The diodes 500, 502 share a common cathode as defined by the N-epi and as depicted by the connection between the diodes 500, 502 in FIG. 5.

When a positive ESD pulse is applied to the pad 404, the upper diode 500 is forward biased, thus providing a lower voltage on the collector of the upper NPN BJT 510 than the emitter 400 of NPN 510. The base-collector junction of the lower transistor 512 is in turn reverse biased. At a certain voltage the base-collector junction of transistor 512 breaks down causing minority carriers in the base-collector junction, which allows current to flow through the upper diode 500 and the lower resistor 442. The voltage drop across the resistor 442 opens the transistor 512. The forward biased diode 500 provides additional injection of holes, which leads to the increase of the current and compensates for the space charge of carriers generated during avalanche multiplication in the base-collector junction, thus decreasing the holding voltage. By varying the level of additional injection of holes by the diode 500, the current-voltage (I-V) curve of the clamp can be controlled. The level of injection in each direction can be varied in different ways, including by varying the number of P+ fingers per NPN BJT finger, by varying the distribution of P+ fingers among the BJT fingers, by varying the distance between the P+ region (finger or ring) and the BJT finger, and by varying the value of the base resistor 442 (for a positive ESD pulse) or resistor 440 (for a negative ESD pulse). By varying one or more of these parameters, the SCR effect can be enhanced or suppressed.

It will be appreciated that during a negative ESD pulse, the operation is similar to that discussed above except that current flow will be from the ground 406 through the diode 502 and the BJT 510, using current flow through the resistor 440 to open up BJT 510.

Figure 6:
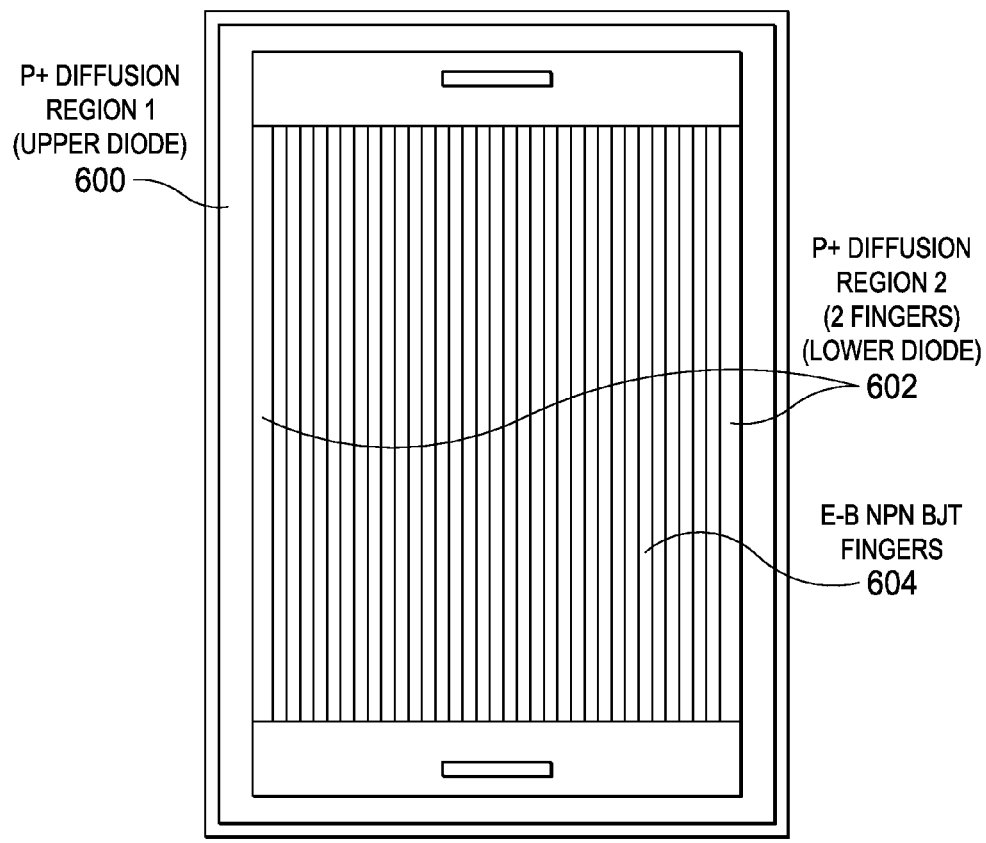
FIG. 6 shows a top view of one embodiment of an ESD protection circuit of the invention.

FIG. 6 shows a top view of one embodiment of an ESD protection circuit of the invention, which shows two different P+ region configurations. In this embodiment the ring-shaped P+ region 600 forms the anode of the upper diode 500 while the anode of the lower diode 502 is formed by a two P+ diffusion regions in the form of fingers 602. The base-emitter fingers 604 are formed between the P+ fingers 602 in this embodiment.

Figure 7:
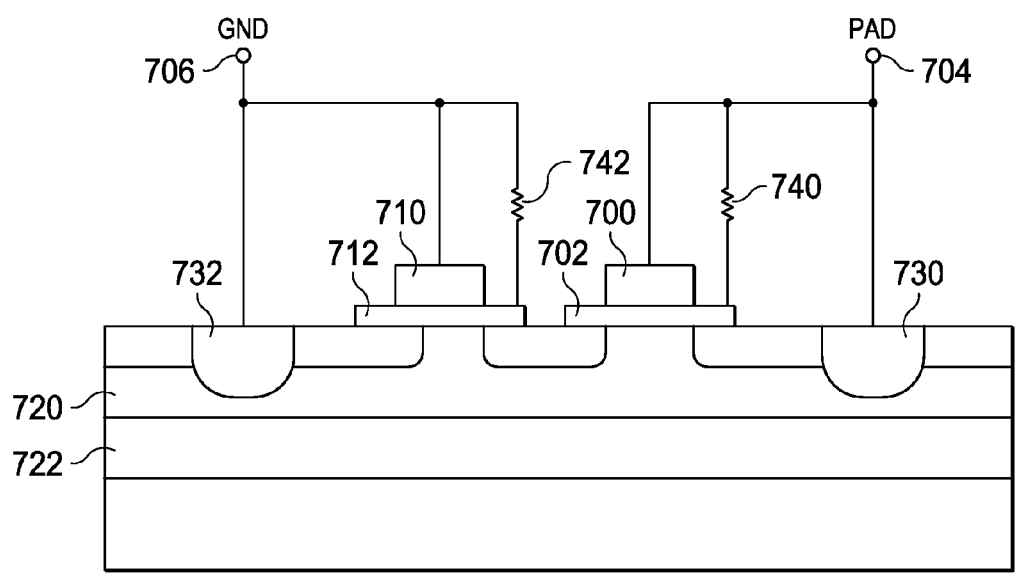
FIG. 7 shows a cross-section through another embodiment of an ESD protection circuit of the invention.

Another embodiment of a dual direction ESD protection circuit of the invention is shown in FIG. 7. Structurally it is similar to the circuit of FIG. 4 but the various regions are connected together differently to achieve different circuit performance.

The circuit of FIG. 7 again includes an NPN BJT that has two base-emitter fingers and a common sub-collector. The base-emitter fingers comprise a first emitter 700 and a first base 702 connected to a high voltage rail or pad 704, and a second emitter 710 and second base 712 connected to ground 706. The common sub-collector is again defined by an N-epitaxial region 720. As in the embodiment of FIG. 4, an n-buried layer (NBL) 722 is formed in the N-epi 720. A first P+ region 730 is connected to the pad 704. A second P+ region 432 is connected to ground 706. By providing P+ regions 730, 732 the BJTs are again capable of adopting bipolar SCR (BSCR) characteristics however, in contrast to the embodiment of FIG. 4 the P+ region (P+ SCR emitter region) is not adjacent to the base-emitter finger with which it forms a discharge circuit from pad to ground during a positive ESD pulse or from ground to pad during a negative ESD pulse. For example during a negative ESD pulse, the current path is defined by the P+ region 732 and the resistor 740 opening up the NPN BJT defined by the emitter 700 and base 702 with sub-collector 720. The emitter 700 and base 702, which are connected to the pad 704 are separated by a gap from the P+ region 732, which is connected to the ground 706. Thus the SCR effect is partly suppressed due to the larger gap between the P+ BSCR emitter 732 and the corresponding BJT finger of emitter 700 and base 702. Similarly during a positive ESD pulse with current path through P+ region 730 and resistor 742 opening up the NPN defined by emitter 710, base 712 and sub-collector 720, the P+ region 730 is separated from the NPN 710, 712 in this embodiment.

While the present invention has been described with respect to a few specific embodiments with a limited number of base-emitter fingers and P+ regions and with specific P+ region configurations, it will be appreciated that the dual direction ESD protection circuit of the present invention can be implemented in different ways without departing from the scope of the invention as defined by the claims.

What is claimed is:

1. A dual direction ESD protection circuit, comprising:
   a first NPN bipolar junction transistor (BJT) having first base, a first emitter and a first collector;
   a second NPN bipolar junction transistor (BJT) having second base, a second emitter and a second collector, wherein the first collector and the second collector are connected together;
   a first diode having a first anode and a first cathode;
   a second diode having a second anode and a second cathode;
   first and second resistors, wherein the first and second resistors are in addition to the first base and the second base;
   a voltage pad and a ground pad;
   wherein the voltage pad is coupled to the first emitter, the first anode and the first base through the first resistor;
   wherein the ground pad is coupled to the second emitter, the second anode and the second base through the second resistor;
   wherein the first cathode and the second cathode are coupled to the first collector and the second collector;
   wherein the dual direction ESD protection circuit is configured to have bipolar SCR (BSCR) characteristics;
   wherein the dual direction ESD protection circuit is embodied in a semiconductor structure;
   a p-type substrate;
   an n-buried layer (NBL) touching the top surface of the p-type substrate;
   an n-type epitaxial layer touching the top surface of the NBL layer,
   wherein the n-type epitaxial layer forms the first and second collectors of the first and second NPN bipolar junction transistors respectively and the first and second cathodes of the first and second diodes respectively;
   a plurality of selective SiGe epitaxial regions touching the top surface of the n-type epitaxial layer, configured to define the first and second bases of the first and second NPN bipolar junction transistors respectively;
   a plurality of n-type emitter regions touching the tops of each of the selective SiGe epitaxial regions, thereby forming the first and second emitters of the first and second NPN bipolar junction transistors respectively;
   a plurality of P+ regions formed in the top surface of the n-type epitaxial layer, configured to define the first and second anodes of the first and second diodes respectively; and
   wherein the plurality of selective SiGe epitaxial regions are spaced apart from each other and the plurality of P+ regions are spaced apart from each other and each of the plurality of selective SiGe epitaxial regions.

2. A dual direction ESD protection circuit disposed in a p-type substrate, comprising:
   an n-buried layer (NBL) directly on the p-type substrate;
   an n-type layer directly on the NBL layer, wherein a shared region of the n-type layer forms a first collector of a first NPN bipolar junction transistor, a second collector of a second NPN bipolar junction transistor, a first cathode of a first diode, and a second cathode of a second diode;
   a plurality of SiGe regions directly on the n-type layer, the plurality of SiGe regions forming a first base of the first NPN bipolar junction transistor and a second base of the second NPN bipolar junction transistor;
   a plurality of n-type emitter regions directly on each of the SiGe regions, thereby forming a first emitter of the first NPN bipolar junction transistor and a second emitter of the second NPN bipolar junction transistor;
   a plurality of P+ regions in the shared region of the n-type layer to form a first anode of the first diode and a second anode of the second diode;
   a voltage pad and a ground pad;
   a first resistor connected between the SiGe region of the first base and the voltage pad, wherein the voltage pad is coupled to the first emitter and the first anode;
   a second resistor connected between the SiGe region of the second base and the ground pad, wherein the ground pad is coupled to the second emitter and the second anode; and
   wherein the plurality of SiGe regions are spaced apart from each other and the plurality of P+ regions are spaced apart from each other and each of the plurality of SiGe regions.

3. The circuit of claim 2, wherein the plurality of SiGe regions and the plurality of n-type emitter regions form multiple emitter-base fingers of a multi-finger NPN.

4. The circuit of claim 3, wherein the p-type region of the first anode surrounds the multi-finger NPN.

5. The circuit of claim 4, wherein the p-type region of the second anode includes a first p-type region at one end of the multiple emitter-base fingers and a second p-type region at an opposite end of the multiple emitter-base fingers.

6. A dual direction ESD protection circuit disposed in a p-type substrate, comprising:
   an n-buried layer (NBL) directly on the p-type substrate;
   an n-type layer directly on the NBL layer, wherein a shared region of the n-type layer forms a first collector of a first NPN bipolar junction transistor, a second collector of a second NPN bipolar junction transistor, a first cathode of a first diode, and a second cathode of a second diode;
   a plurality of SiGe regions directly on the n-type layer, the plurality of SiGe regions forming a first base of the first NPN bipolar junction transistor and a second base of the second NPN bipolar junction transistor;
   a plurality of n-type emitter regions directly on each of the SiGe regions, thereby forming a first emitter of the first NPN bipolar junction transistor and a second emitter of the second NPN bipolar junction transistor;
   a plurality of P+ regions in the shared region of the n-type layer to form a first anode of the first diode and a second anode of the second diode; and
   wherein the plurality of SiGe regions are spaced apart from each other and the plurality of P+ regions are spaced apart from each other and each of the plurality of SiGe regions.

7. The circuit of claim 6, wherein the plurality of SiGe regions and the plurality of n-type emitter regions form multiple emitter-base fingers of a multi-finger NPN.

8. The circuit of claim 7, wherein the p-type region of the first anode surrounds the multi-finger NPN.

9. the circuit of claim 8, wherein the p-type region of the second anode includes a first p-type region at one end of the multiple emitter-base fingers and a second p-type region at an opposite end of the multiple emitter-base fingers.

* * * * *